(12) United States Patent
Walton et al.

(10) Patent No.: US 6,544,311 B1
(45) Date of Patent: Apr. 8, 2003

(54) CHASSIS THERMAL ZONES

(75) Inventors: Richard A. Walton, Carol Stream, IL (US); Zbigniew Kabat, Schaumburg, IL (US); Paul Tyschenko, Bartlett, IL (US)

(73) Assignee: AG Communication Systems Corporation, Phoenix, AZ (US)

( * ) Notice: Subject to any disclaimer, the term of this patent is extended or adjusted under 35 U.S.C. 154(b) by 0 days.

(21) Appl. No.: 10/123,475

(22) Filed: Apr. 17, 2002

(51) Int. Cl.⁷ ............................................... H05K 7/20
(52) U.S. Cl. ...................... 55/385.6; 361/695; 454/184
(58) Field of Search ...................... 454/184; 55/385.6, 55/418, 419, 467, 472, 473; 361/695; 174/17 VA; 62/259.2

(56) References Cited

U.S. PATENT DOCUMENTS 6,185,109 B1 * 2/2001 Koradia et al. ............. 361/818
6,198,628 B1 * 3/2001 Smith ......................... 361/695

* cited by examiner

*Primary Examiner*—Harold Joyce
(74) *Attorney, Agent, or Firm*—David J. Zwick

(57) ABSTRACT

A system for cooling an electrical chassis in which two separate zones are formed within the chassis by horizontal separators forming an internal floor and a ceiling, and a mid-located backplane acting as a vertical separator, spanning from floor to ceiling. Air flow volume through the zones is controlled separately through the use of separate air intake filters that may have different filter densities and sizes, and appropriate fan pack size.

1 Claim, 4 Drawing Sheets

US 6,544,311 B1

CHASSIS THERMAL ZONES

FIELD OF THE INVENTION

The present invention relates to a system for air flow cooling of electrical equipment chassis, and more particularly to a system that allows for different air flow volumes for separate thermal zones of a chassis.

BACKGROUND OF THE INVENTION

In electronic systems, components such as circuit boards are typically housed in chassis or enclosures. It is common for the circuit boards to be arranged vertically side-by-side, and to plug into a backplane. It is also common to have a mid-located backplane with a set of circuit cards that plug into the backplane from the rear. In the past, this set of rear cards tended to comprise mostly passive components. However, the rear set of cards is now including more and more active components.

Typically, the circuit boards produce excess heat that must be removed from the chassis. This is commonly done using a fan pack for forced air ventilation placed at the top of the enclosure that draws air through openings at the bottom of the enclosure and past the circuit cards. Typically, all areas within the enclosure are in air-flow communication with each other, and the minimum required air flow through the chassis is governed by the area with the highest cooling requirements.

A problem with this common approach to cooling a chassis occurs when efficient air flow through the different areas, or zones, within the chassis is desired, and the different zones have different cooling requirements. For example, in the arrangement described above with a mid-located backplane, it is possible that the circuit cards located in front of the backplane have a much higher cooling requirement than the circuit cards located to the rear of the backplane. With all areas within the chassis communicating, it may be difficult to achieve efficient air flow rates in different chassis zones.

SUMMARY OF THE INVENTION

Accordingly, it is an object of the present invention to provide a system for air cooling a chassis wherein different zones within the chassis are efficiently cooled.

The present invention is a system for cooling an electrical chassis, in which, in a preferred embodiment, two separate zones are formed within the chassis through the use of horizontal separators forming an internal floor and a ceiling, and a backplane, acting as a vertical separator, spanning from floor to ceiling. The upper horizontal separator has openings allowing air flow. The lower horizontal separator may have openings, or may be solid, with the chassis side, front and rear panels having perforations or openings directly above the lower horizontal separator to allow air flow. An exhaust fan pack is placed above the ceiling separator and draws air through both zones. Air flow volume through the zones is controlled separately through the use of separate intake filters that may have different filter densities and sizes, and appropriate fan pack size.

DESCRIPTION OF THE PREFERRED EMBODIMENT

Figure 1:
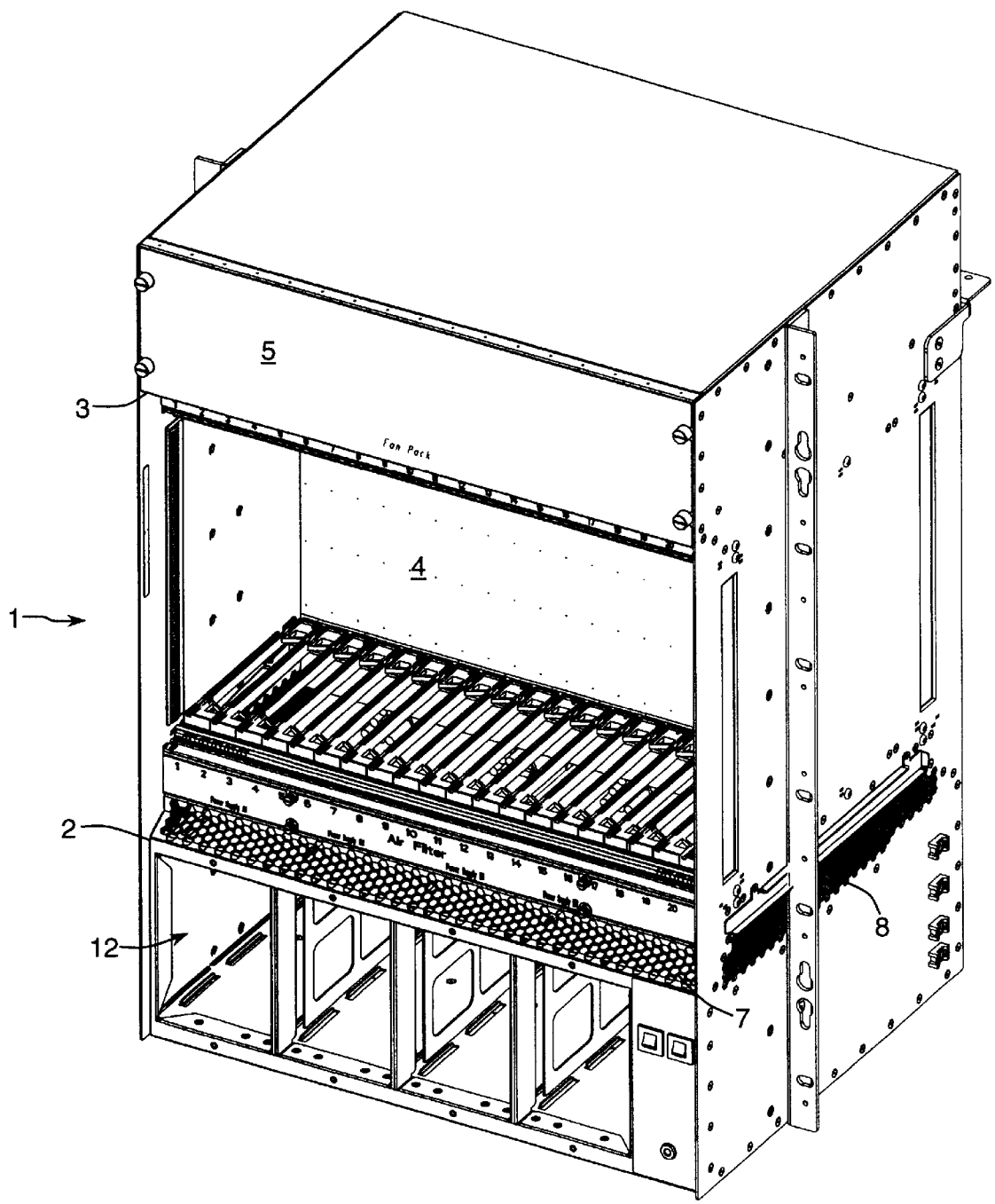
FIG. 1 shows a front perspective view of a chassis embodying the air cooling arrangement of a preferred embodiment of the present invention.
Figure 2:
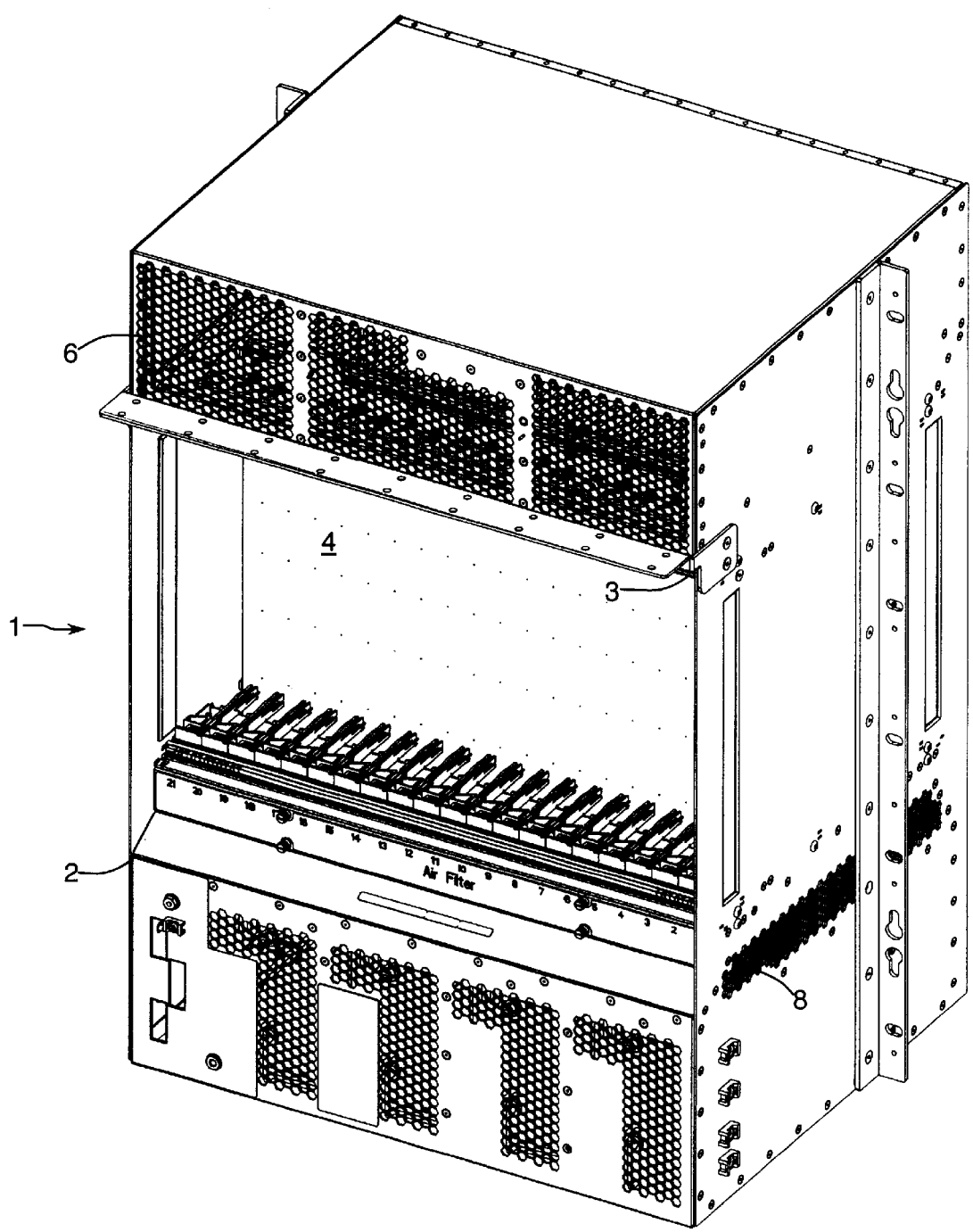
FIG. 2 shows a rear perspective view of a chassis embodying the air cooling arrangement of a preferred embodiment of the present invention.

FIGS. 1 and 2 show front and rear perspective views, respectively, of a chassis 1 embodying the air cooling arrangement of the present invention. Horizontal plates, located at 2 and 3, and mid-located backplane 4 form internal floors, ceilings and back walls, respectively, for a front card cage thermal zone as shown in FIG. 1, and a rear card cage thermal zone as shown in FIG. 2. Mid-located should be understood to mean a location between the front and rear of chassis 1 that allows circuit cards to be installed on both the front face and rear face of backplane 4. The side panels of chassis 1 form the side walls of the front and rear card cage thermal zones. A front chassis panel and a rear chassis panel, neither of which is shown, form the front walls of the front and rear card cage thermal zones, respectively.

Horizontal plates 2 and 3 span front to back and side to side of chassis 1. Backplane 4 spans side to side of chassis 1, and from horizontal plate 2 to horizontal plate 3.

In the preferred embodiment, horizontal plate 2, backplane 4, the side, front and rear panels of chassis 1, as they are all coincident with the front and rear card cage thermal zones, have essentially no through openings that would allow direct communication between the front and rear card cage thermal zones.

A fan pack for forced air ventilation is situated above horizontal plate 3 in a fan pack compartment, between fan pack compartment front panel 5 and perforated metal fan pack compartment rear panel 6. Horizontal plate 3 has openings that allow the fan pack compartment to communicate with both the front and rear card cage thermal zones.

The front panel and the side panels of chassis 1 are perforated at 7 and 8, respectively, at advantageous locations above horizontal plate 2, so as to allow the front and rear card cage thermal zones to communicate with the environment outside of chassis 1.

Figure 3:
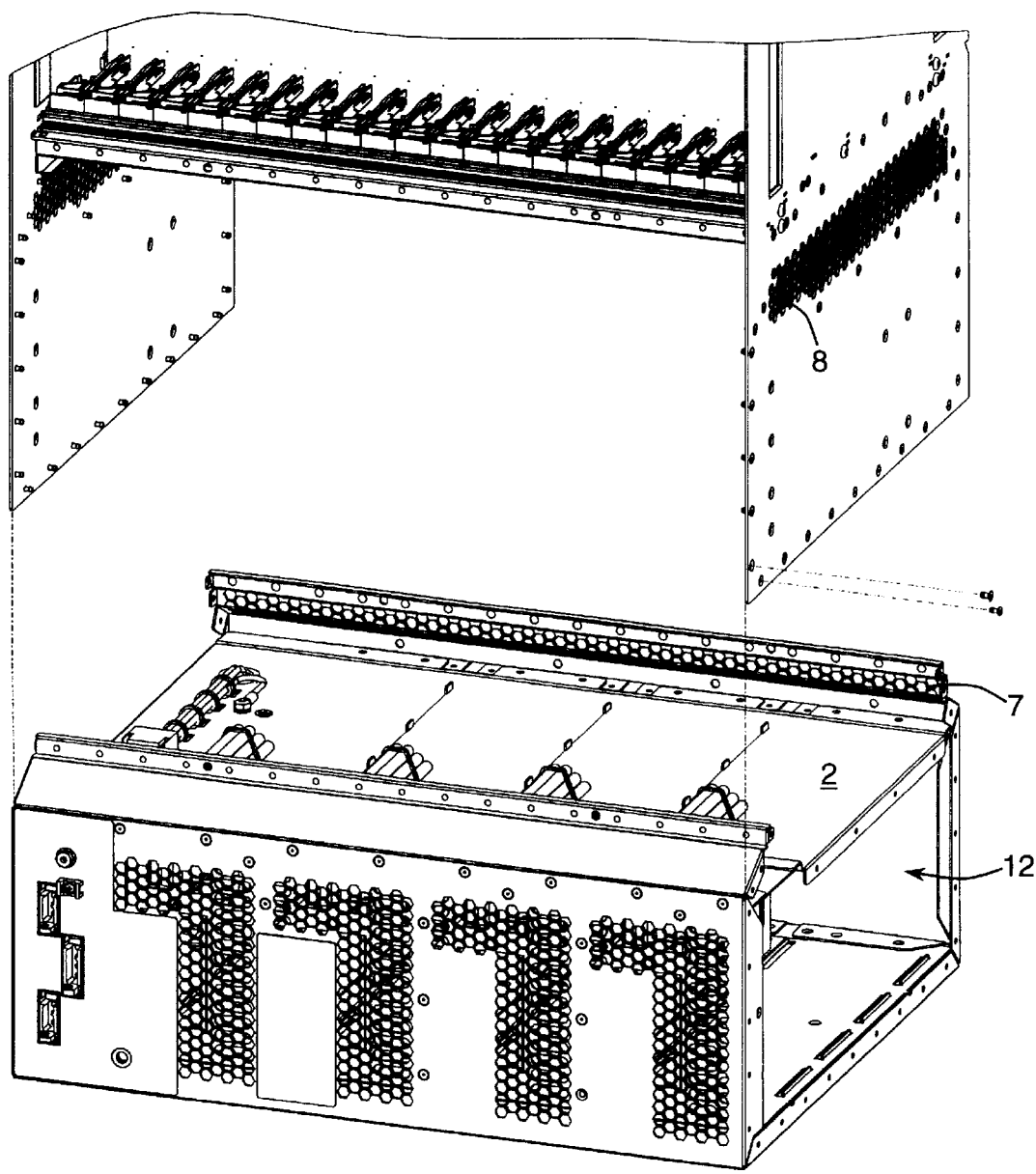
FIG. 3 shows a rear detail exploded perspective view of a chassis embodying the air cooling arrangement of a preferred embodiment of the present invention.

FIG. 3 shows a rear exploded view of chassis 1, showing in more detail horizontal plate 2. Also shown are the perforations at 7 and 8 that allow the front and rear card cage thermal zones to communicate with the environment outside of chassis 1.

Figure 4:
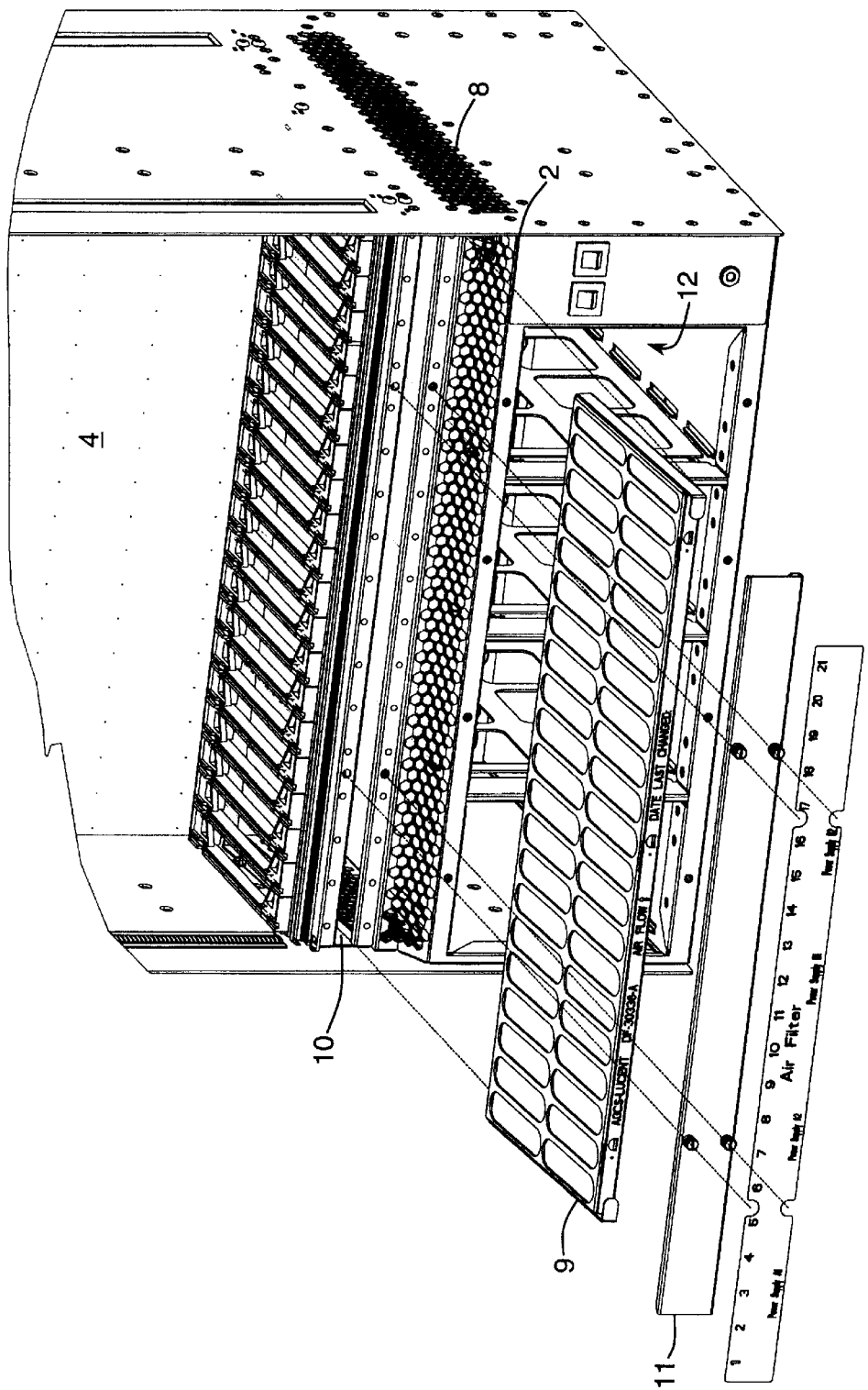
FIG. 4 shows a front detail exploded perspective view of the filter arrangement of a chassis embodying the air cooling arrangement of a preferred embodiment of the present invention.

FIG. 4 shows a front exploded view showing the filter arrangement for the front card cage thermal zone. Air filter 9 slides into opening 10. Filter cover plate 11 then attaches to the front face of chassis 1 to hold air filter 9 in place, and to seal opening 10. When in place, filter 9 sits above the perforations at 7 and 8 and forms a filtered barrier between the front card cage thermal zone and the environment outside of chassis 1 via perforations 7 and 8. In similar fashion, an air filter slides into an opening on the rear of chassis 1 and forms a barrier between the rear card cage thermal zone and the environment outside of chassis 1 via perforations 8.

In operation, the fan pack situated above horizontal plate 3 draws air through both the front and rear card cage thermal zones via perforations 7 and 8. The air is drawn through front air filter 9, and the rear air filter. Air flow volume through the front and rear card cage thermal zones is governed separately through the use of the separate intake air filters, which may have different parameters such as filter densities and sizes, and appropriate fan pack size. Air flow volume is engineered through filter size and density and fan pack size such that each thermal zone efficiently receives sufficient air flow to cool the circuit boards and other components contained therein.

In the particular embodiment illustrated in the figures, chassis 1 has compartments 12 to receive a set of power supplies.

While the preferred embodiment shown describes ventilation means comprising a fan pack located above the upper horizontal plate that draws air through openings in the plate, a solid lower horizontal plate, and perforations in the side, front and rear panels below the air filters, other ventilation means maybe used. For example, perforations 7 and 8 may be any type of openings that allows the thermal zones to communicate with the environment outside of the chassis. The chassis may not have bottom power supply compartments, in which case the bottom panel of the chassis may act as the lower horizontal plate, and openings in the bottom panel may be used for air intake. The fan pack may be located at the bottom of the chassis and draw air downward through the thermal zones. The fan pack could force air through filters and into and through the thermal zones. Ducting arrangements may be used if a remote fan pack arrangement is desired.

While the present invention has been shown and described with respect to a preferred embodiment, it will be understood by those skilled in the art that modifications may be made thereto without departing from the scope and spirit of the invention. It is intended that the scope of the invention be defined by the claims appended hereto and their equivalents.

What is claimed is:

1. An air flow cooling system for an electrical chassis, said system comprising:

an electrical chassis comprising side, front and rear panels;

an upper horizontal plate spanning side-to-side and front-to-back within said chassis;

a lower horizontal plate spanning side-to-side and front-to-back within said chassis;

a mid-located backplane spanning side-to-side and from the bottom face of said upper horizontal plate and from the top face of said lower horizontal plate;

said front and side panels, said upper horizontal plate, said lower horizontal plate, and said mid-located backplane forming a front thermal zone within said chassis;

said rear and side panels, said upper horizontal plate, said lower horizontal plate, and said mid-located backplane forming a rear thermal zone within said chassis;

said front and rear thermal zones not in direct communication with each other;

ventilation means forcing air flow through said front and rear thermal zones; and front and rear thermal zone air filters, said air flow flowing through said air filters before flowing through said front and rear thermal zones;

said front and rear thermal zone air filters and said ventilation means governing separate air flow volumes through said thermal zones.

* * * * *